United States Patent [19]

Daleo et al.

[11] Patent Number: 4,873,563

[45] Date of Patent: Oct. 10, 1989

[54] SOLID STATE MONOLITHIC SWITCHING DEVICE

[75] Inventors: Stephen L. Daleo, Parkville, Mo.; James B. Compton, Los Gatos, Calif.

[73] Assignee: Synectics, Inc., Kansas City, Mo.

[21] Appl. No.: 188,809

[22] Filed: May 2, 1988

[51] Int. Cl.[4] .......................................... H01L 27/02
[52] U.S. Cl. .................................... 357/41; 357/23.4; 357/49; 357/47
[58] Field of Search ..................... 357/41, 49, 23.4, 47

[56] References Cited

U.S. PATENT DOCUMENTS

| | | | |
|---|---|---|---|
| 4,242,697 | 12/1980 | Berthold et al. | 357/49 |
| 4,287,526 | 9/1981 | Sakuma | 357/49 |
| 4,742,380 | 5/1988 | Chang | 357/43 |
| 4,766,482 | 8/1988 | Smeltzer | 357/23.7 |

FOREIGN PATENT DOCUMENTS 59-110132  6/1984  Japan ..................................... 357/49

Primary Examiner—Andrew J. James
Assistant Examiner—Mark Prenty
Attorney, Agent, or Firm—Townsend and Townsend

[57] ABSTRACT

A monolithic switching array integrated with control logic on a dielectrically isolated monolithic substrate is provided wherein individual components are constructed in abutment with the oxide walls of the dielectrically isolated wells to form a diffusion/wall interface. As a consequence, area of the wells can be optimally used, and undesired electric fields around the components are minimized, thus allowing for smaller overall chip dimensions as compared with comparable prior art dielectric isolation (d.i.) or junction isolated construction techniques. Moreover, d.i. construction eliminates undesired parasitic devices in a monolithic circuit and allows for improved system accuracy.

7 Claims, 4 Drawing Sheets

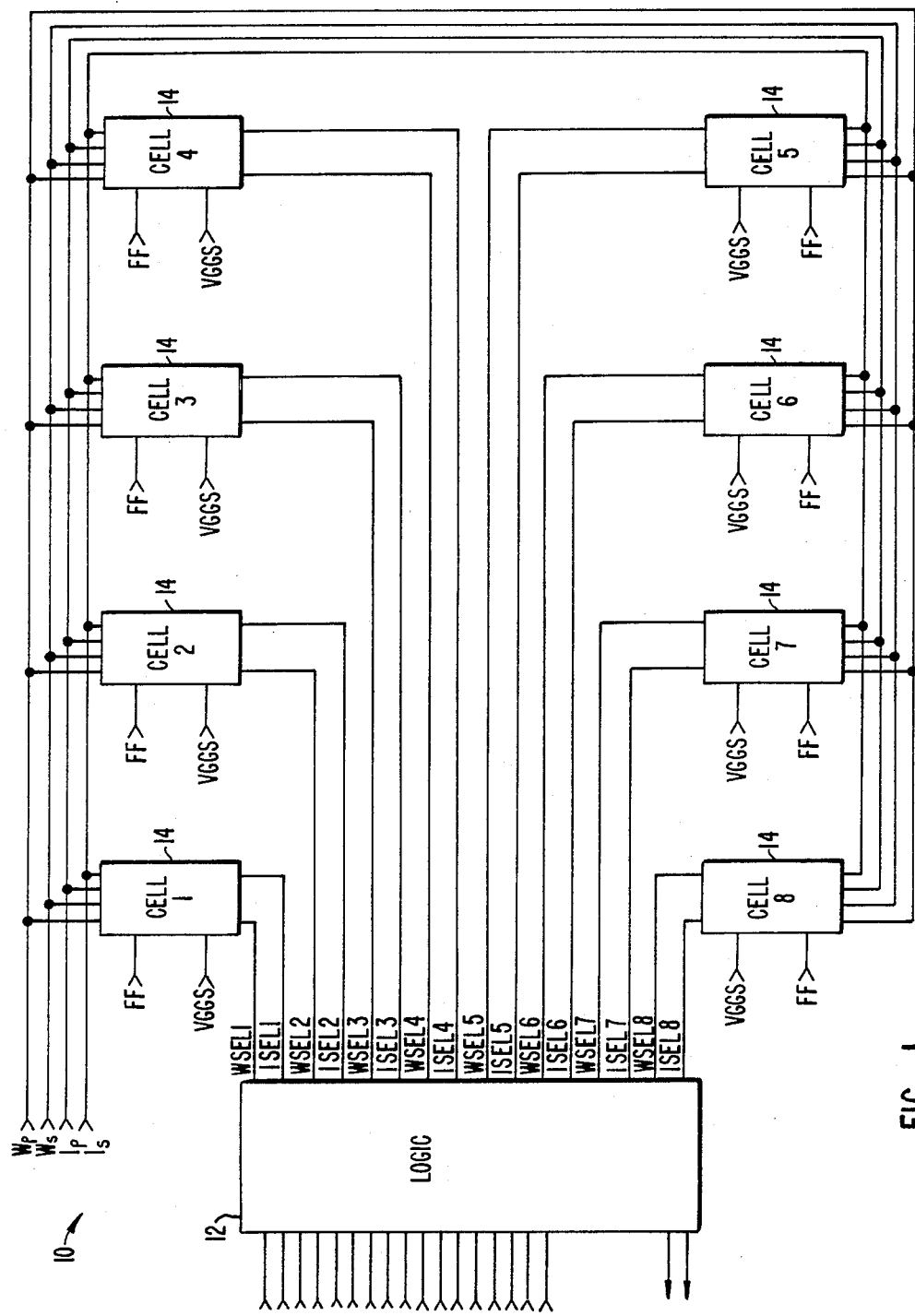
FIG._1.

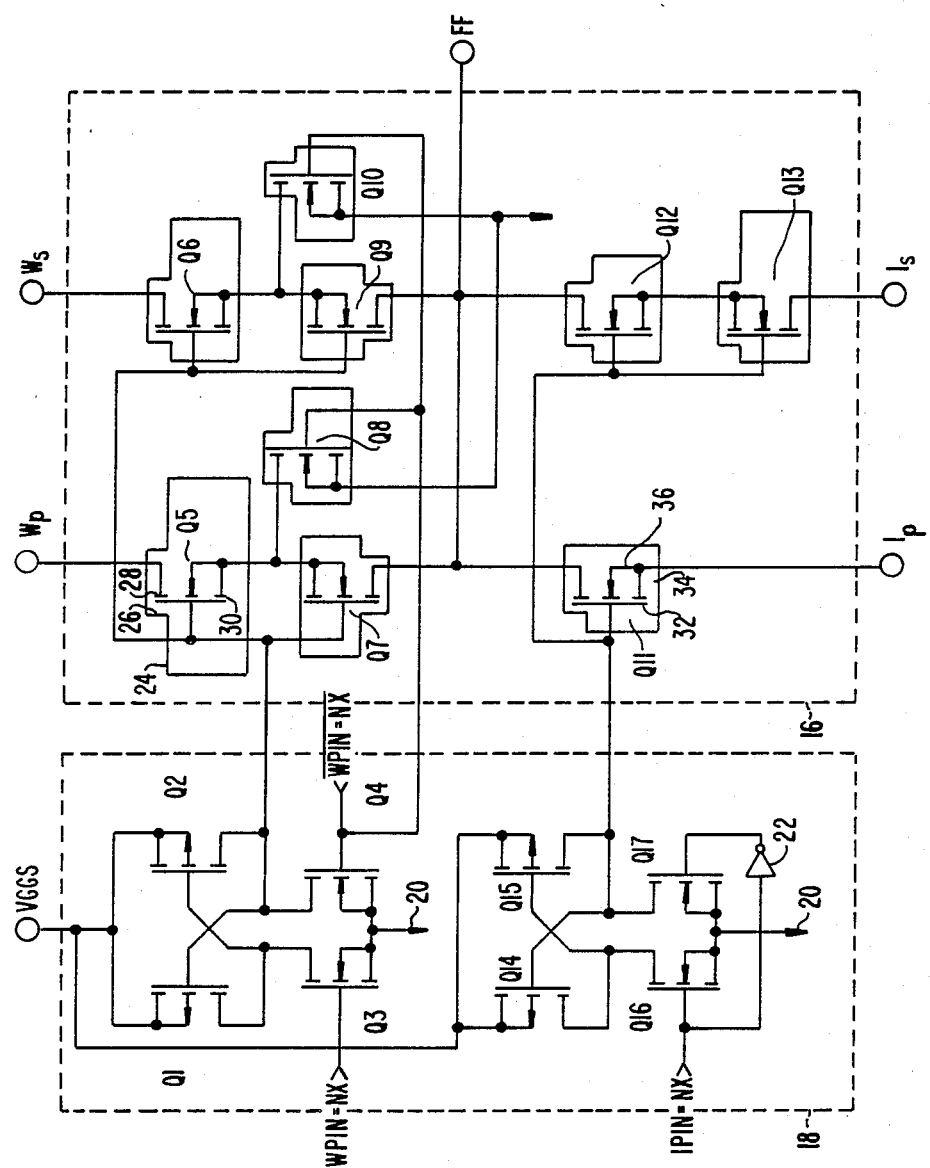
FIG._2.

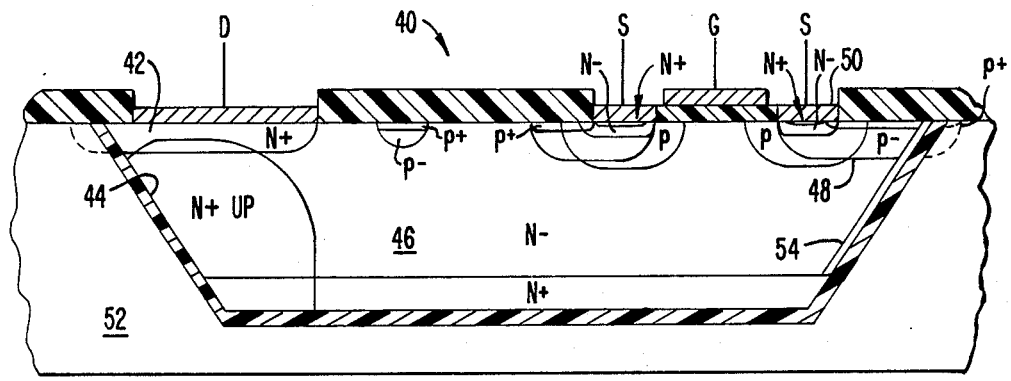
FIG._3.
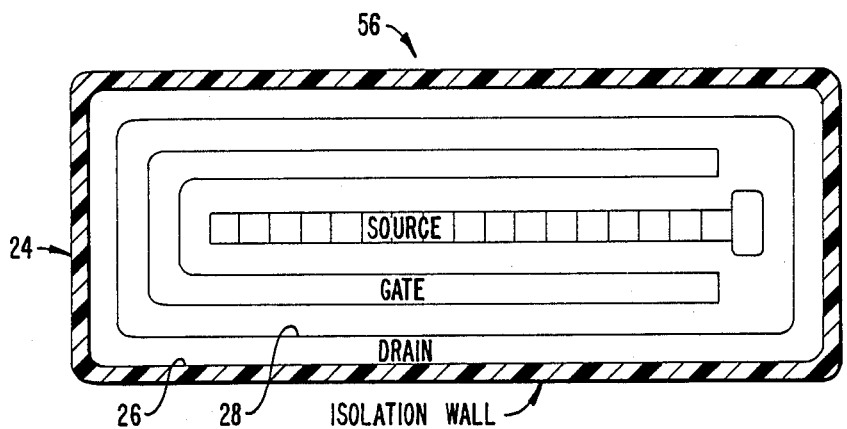
FIG._4.

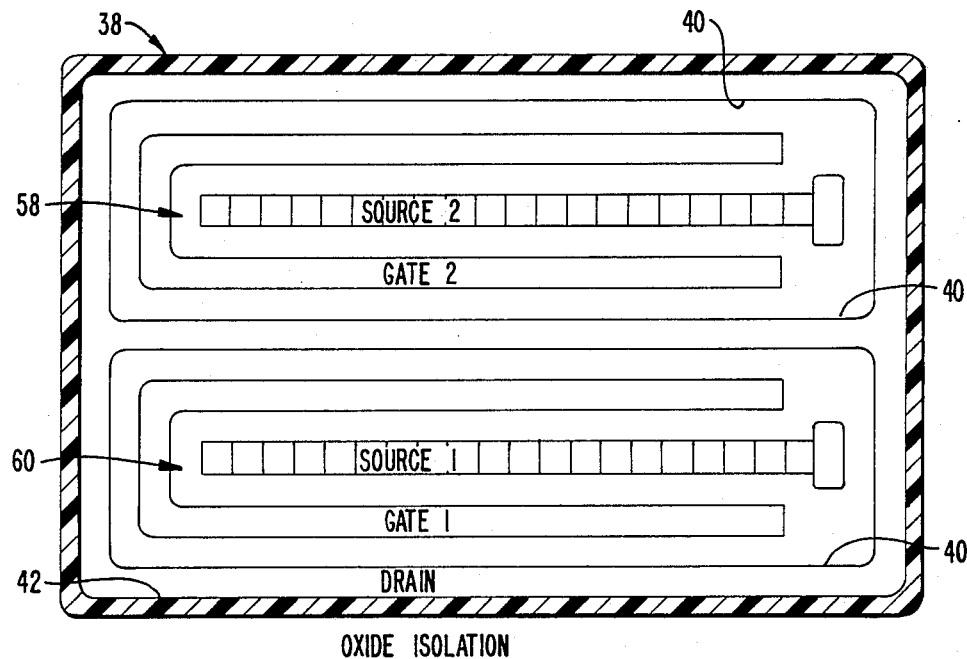
FIG._5.

SOLID STATE MONOLITHIC SWITCHING DEVICE

BACKGROUND OF THE INVENTION

The present invention relates to monolithic analog signal switches, and more particularly to high voltage analog switches and control circuitry constructed on a dielectrically isolated substrate. A typical application of such a device is in an instrument used for measuring small currents accurately over a wide dynamic range of voltages. Such a device might be used in a bridge measurement circuit and more specifically in a wiring analyzer system where several thousand of the switching devices are connected in parallel to form a switching matrix. An automatic test equipment (A.T.E.) application may require floating, high speed, high voltage switches.

Devices constructed on a dielectrically isolated substrate, known as a d.i. substrate, have specific advantages over devices constructed using conventional junction isolation technology in certain classes of monolithic semiconductor devices. Whereas junction isolated devices on a substrate always combine to form undesired parasitic devices between active devices and the substrate (such as bipolar transistors, MOSFETs and SCRs), a d.i.-based device does not. Components constructed on a d.i. substrate are isolated in individual wells of monocrystalline silicon surrounded on all sides by a shell deposit of silicon dioxide and supported by a polysilicon backing. For high voltage applications, therefore, a device employing d.i.-based components can be more tightly packed than a comparable junction isolated device.

D.i. substrates are expensive because of the extensive processing required to prepare the stock substrate. It is therefore desirable to make more efficient use within an isolation well of a d.i. substrate.

It is advantageous in an analog switching device that the control components be closely associated with the switching components for performance, reliability and cost reasons. In the past, control components have been constructed in monolithic form, such as a gate array, on dedicated die, and then are combined in hybrid packaging with switching components, which were either as a monolithic or hybrid implementation. Efforts have also been made to construct switching devices combining control and switching components on a monolithic substrate. For example, junction isolation devices are built by Mitel, Inc. of Boca Raton, FL for use in low voltage and/or low current applications such as crosspoint switching in a telephone network.

It has been found that monolithic junction isolated switching devices are unsatisfactory in applications where high accuracy and/or high voltage are critical parameters. It is critical for example that there be no current leakage between active components or through the substrate which could effect measurement accuracy. What is needed is a reliable, accurate and relatively inexpensive monolithic switching device capable of switching operation at voltages and currents greater than is used for conventional monolithic-based control applications, and more particularly in voltage ranges above about 20 volts to about 300 V and currents above about 10 mA to about 1 Ampere.

Attempts have been made to build and sell d.i. based analog switching arrays since about 1985. For example, Telmos, Inc., of Sunnyvale, CA, now defunct, manufactured a monolithic analog switch and control array on a d.i. substrate for Electronic Systems and Programming, Inc. of Camarillo, CA, now Test Systems/ESP, a subsidiary of Xebec, Inc., the parent company of the assignee of the present invention. The device was described in EDN Magazine. The device was necessarily relatively large and consequently not cost effective. As a result, the product was a commercial failure and resulted in the failure of Telmos, Inc.

AT&T Technologies of Reading, PA recently introduced a high voltage gate array on a d.i. substrate. Currently, however, AT&T Technologies is providing custom design services for d.i.-based switching devices.

SUMMARY OF THE INVENTION

According to the invention there is provided a monolithic switching array integrated with control logic on a dielectrically isolated monolithic substrate wherein individual components are constructed in abutment with the oxide walls of the dielectrically isolated wells to form a diffusion/wall interface. As a consequence, area of the wells can be optimally used, and undesired electric fields around the components are minimized, thus allowing for smaller overall chip dimensions as compared with comparable prior art d.i. or junction isolated construction techniques. Moreover, d.i. construction eliminates undesired parasitic devices in a monolithic circuit and allows for improved system accuracy.

The invention will be understood in more detail by referring to the following detailed description and claims and to the drawings in which,

BRIEF DESCRIPTION OF THE DRAWINGS

FIG. 1 is a block diagram of an integrated switch array incorporating the invention.

FIG. 2 is a is schematic diagram of a switching cell in accordance with the invention.

FIG. 3 is a cross-sectional view of a DMOS switching device constructed in accordance with the invention.

FIG. 4 is a top view of a single transistor in a well.

FIG. 5 is a top view of two transistors in a well wherein the transistors share a common drain.

DETAILED DESCRIPTION OF SPECIFIC EMBODIMENTS

Referring now to FIG. 1, there is a shown a block diagram of an integrated switch array 10 incorporating the invention. The switch array 10 comprises a control logic unit 12 coupled to a plurality of switching cells 14. Eight switching cells 14 are shown for illustrative purposes. In implementation, there may greater or fewer such cells coupled to the control logic unit 12. According to the invention, the control logic unit 12 and a plurality of switching cells 14 are monolithically combined on a single dielectrically isolated substrate (FIG. 3) wherein selected elements of the switching cells 14 are formed or constructed in separate tubs in the substrate (FIG. 2). Stock substrates are available from several sources. For example, stock d.i. substrates are available from suppliers such as Texas Instruments, Inc. of Dallas, TX and Dielectric Semiconductor of San Jose, CA. The interconnections between tubs (FIG. 2) and to pinouts of the switch array 10 are formed as a pattern of a metallization layer overlaying the structure of the switch array 10.

Referring now to FIG. 2, there is shown a schematic diagram of a specific embodiment of a switching cell 14 in accordance with the invention. The switching cell 14 comprises two sections: a switching section 16 and a level translation section 18. The switching section 16 floats with respect to ground. The level translation section 18 is referenced to ground 20 and provides the voltage needed to control the switching section over the full voltage operating range of the switching section 16.

All of the active components in the switching section 16, consisting of transistors Q1, Q2, Q3, Q4, Q5, Q6, Q7, Q8, Q9, Q10, Q11, Q12, and Q13, are preferably N-channel lateral DMOS (double diffused metal oxide semiconductor) devices having inherently low leakage characteristics. The DMOS devices are fabricated during a CMOS fabrication process used elsewhere on the substrate. As shown, each of the DMOS devices is configured in a four-wire Kelvin configuration. A first external terminal Wp is designated as the high voltage force terminal. A second external terminal Ip is designated as the return voltage terminal for the stimulus. A third external terminal Ws is the sense terminal for the force voltage. A fourth external terminal Is is the sense terminal for the return voltage. A fifth external terminal FF is the front face terminal for the switch. It is presumed that only high impedance connections are provided at terminals Ws and Is so that voltage can be sensed at the high voltage force terminal and the return voltage terminal. Gates of force and sense elements are tied together so that a force line and a sense line must be on simultaneously.

The level translation section comprises a pair of four-transistor groups, with Q1, Q2, Q3 and Q4 in a first group, and Q14, Q15, Q16 and Q17 in a second group, some of which are P- type field devices and others of which are small N-channel DMOS devices. In a P- field device, the field oxide forms the gate oxide. Structures of this type have a higher breakdown voltage than a P type field transistor. Transistors Q1 and Q2 are P-channel devices, as are transistors Q14 and Q15. Transistors Q3 and Q4 are the N-channel devices as are transistors Q16 and Q17. The gate of transistor Q1 is cross coupled to the drain of transistor Q2 and the drain of transistor Q4. The gate of transistor Q2 is cross coupled to the drain of transistor Q1 and the drain of transistor Q3. Similarly, the gate of transistor Q14 is cross coupled to the drain of transistor Q15 and the drain of transistor Q17. And the gate of transistor Q15 is cross coupled to the drain of transistor Q14 and the drain of transistor Q16.

One output select signal from the control logic unit 12 (FIG. 1) is provided as WPIN to the gate of transistor Q3. Another output select signal from the control logic unit 12 is provided as IPIN to the gate of transistor Q16. The input signal to the gate of transistor Q4 is constrained (either internally or externally) to be inverted in relation to the input signal to the gate of transistor Q3. Similarly, the input signal to the gate of transistor Q17 is constrained (either internally or externally) to be inverted in relation to the input signal to the gate of transistor Q16. An inverter 22 may be provided for this purpose.

The purpose of the level translator section 18 is to convert standard 5 volt logic levels to a voltage near the VGGS voltage at the gates of the transistors in the switching section 16. The voltage VGGS is preferably at least 10 volts higher than the maximum design switching voltage of the switching section 16.

A switching cell 14 operates as follows: It is first assumed the Ip terminal is at zero V potential with respect to the most negative power supply in the logic. In one translator section, WPIN is raised to 5 V and WPIN bar is driven to zero V to turn on transistors Q5, Q6, Q7, Q9 and thereby turning on Q3 and turning off Q4. Since Q3 is on, the gate of Q2 is pulled close to zero V, turning on Q2. With Q2 on, the gates of Q5, Q6, Q7 and Q9 are all driven to the VGGS voltage. Since Q4 is off and Q2 is on, the gate of Q1 is also driven to VGGS, turning off Q1. After a period for any transient, no current is drawn from the VGGS supply. Since Q5, Q6, Q7 and Q9 are all at VGGS, they are all on, and any voltage applied to the Wp terminal will appear across the FF terminal. The potential at the FF terminal may be measured at the Ws terminal with a high impedance circuit. Transistors Q8 and Q10 will be off since their gates and sources are both at zero V. As the Wp voltage approached the VGGS voltage, the switches begin to turn off because of the lack of positive bias of the gates of Q5, Q6, Q7 and Q9 relative to their sources.

In order to turn off the switches, the logic state at WPIN is simply reversed. The operation of the translator controlling the transistors Q11, Q13, Q13 is identical to the operation just described.

Referring again to FIG. 2, a feature of the invention is depicted schematically, namely, the provision of silicon tubs or wells 24 in which active components reside in dielectric isolation from one another. More specifically, according to the invention, an active device, such as a vertical DMOS field effect transistor or a lateral DMOS field effect transistor device, is disposed within a dielectrically isolated well with at least one margin of a diffusion forming one or more terminals of the device abutting the isolation wall defining the well to form a diffusion/wall interface. There are numerous advantages in having the diffusion abutting the isolation wall. First, there is space savings. Less surface area is wasted, so the well can be more fully utilized for active devices. In one embodiment there may be about 50 wells, each of which contains at least one transistor. One benefit of the invention is that the wells may be smaller than they would otherwise be using conventional d.i. design rules. Specifically, the well can be smaller for comparable power rated devices than otherwise.

Second, the electric fields associated with the terminal are truncated at the side wall. Therefore, there is less risk of surface breakdown at the abutting margin. As a result, there can be a greater number of wells on a substrate than under conventional d.i. design rules.

In a specific embodiment, referring to transistor Q5 of FIG. 2, the wall 26 of well 24 is juxtaposed to the drain 28. Moreover, the wall 26 may abut three of four margins of the drain 28, as schematically depicted. It is not always structurally convenient for the source 30 to abut the wall 26, as for example as in an interdigitated or hexagonal structure. However, as schematically suggested in connection with other transistors (Q11, Q12, Q13, for example), a source 32 can also abut a well wall 34, and particularly along the body 36 of the source 32.

To connect transistors in different wells, metallization is provided on the device surface between wells, as is conventional.

FIG. 3 illustrates in cross section a vertical DMOS transistor 40 in accordance with one embodiment of the invention. Therein the drain 42 abuts the wall 44 of the well 46, and the body 48 of the transistor 40 adjacent (under) the source 50 abuts the wall 44 of the well 46. The drain diffusion is truncated by the isolation wall 44. The monocrystalline silicon substrate forming the well is dielectrically isolated from a polysilicon backing 52 by the isolation wall 44 formed by normal wet oxidation processes to yield silicon dioxide. (In accordance with conventional d.i. wafer processing, the polysilicon backing 52 is applied after oxidation.) The details of the layers and diffusions of the DMOS transistor 40 are shown, but no discussion is required as those details are not relevant to the invention.

In accordance with a further specific embodiment of the invention, a sidewall doping 54 of the well 46 is provided between the oxide forming the wall 44 and the body 48. Under certain circumstances, the sidewall, when abutting a diffusion, will form an undesired parasitic MOSFET wherein the isolation oxide will act as the gate. A thin layer of dopant on all or a particularly sensitive part of the inner surface of the wall sufficient to prevent inversion along the interdiffusion channel of any parasitic MOSFET formable under expected operating conditions is considered suitable. While formation of a parasitic MOSFET is possible, proper design procedures and careful processing procedures should minimize the incidence of formation.

Various physical geometries are possible. In FIG. 4 there is an example of a single transistor 56 in an interdigitated geometry showing abutment of one drain 28 against a wall 26 in a well 24. In this example, the drain 28 completely surrounds the gate and the source, so the drain 28 also abuts the wall 26 along its entire length.

In FIG. 5, a dual transistor well 38 is illustrated wherein a drain 40 common to both transistors 58 and 60 abuts a wall 42. This structure is an efficient use of well area made possible by the invention.

While the system has been described in order to illustrate the preferred embodiments, variations and modifications to the herein described system within the scope of the invention, would undoubtedly suggest themselves to those skilled in the art. Accordingly, the foregoing description should be taken merely as illustrative and the invention should be limited only in accordance with the accompanying claims.

We claim:

1. In a monolithic integrated double-diffused Metal Oxide Semiconductor circuit constructed on a dielectrically isolated monolithic silicon substrate, wherein individual components are formed within wells, each well formed by a dielectric isolation wall, the improvement comprising:
   a source diffusion of said individual component abutted to said wall to form a diffusion/wall interface in silicon for maximizing use of area within said well and for minimizing undesired electric fields at the diffusion/wall interface;
   a drain diffusion of said individual component abutted along a majority of its surface periphery to said wall to form a diffusion/wall interface in silicon for maximizing use of area within said well and for minimizing undesired electric fields at the diffusion/wall interface; and
   a thin layer of dopant provided on at least a part of the inner surface of a side portion of the wall bridging said source diffusion and a bottom of said well and bridging said drain and said bottom of said well, said dopant being in sufficient concentration to prevent inversion along an interdiffusion channel of a parasitic MOSFET formable under expected operating conditions.

2. In an integrated circuit according to claim 1, wherein a diffusion/wall interface is formed along sides of the drain diffusion adjacent an isolation wall.

3. In an integrated circuit according to claim 1, wherein said integrated circuit comprises a monolithic switching array integrated with control logic on said dielectrically isolated monolithic substrate, such that said switching array is substantially free of parasitics.

4. A solid state monolithic switching device comprising:
   a monolithic switching array having active components for conducting an analog signal, said active components being monolithically constructed in first dielectrically isolated wells formed by oxide walls in a monolithic backing in dielectric isolation from other active components;
   control logic circuitry, said control logic circuitry being electrically coupled to said monolithic switching array for controlling switching of said active components, said control logic circuitry being constructed in second dielectrically isolated wells formed by oxide walls in said monolithic backing in dielectric isolation from said first wells;
   wherein at least one of said active components is constructed with at least one diffusion in abutment with the oxide walls of the dielectrically isolated wells to form a diffusion/wall interface for maximizing use of area within a well and forminimizing undesired electric fields at the diffusion/wall interface, wherein a diffusion/wall interface is formed along at least a portion of a drain diffusion wherein a diffusion/wall interface is formed along all sides of the drain diffusion adjacent an isolation wall, and wherein a diffusion/wall interface is additionally formed along at least a portion of a source diffusion.

5. A solid state monolithic switching device comprising:
   a monolithic switching array having active components for conducting an analog signal, said active components being monolithically constructed in first dielectrically isolated wells formed by oxide walls in a monolithic backing in dielectric isolation from other active components;
   control logic circuitry, said control logic circuitry being electrically coupled to said monolithic switching array for controlling switching of said active components, said control logic circuitry being constructed in second dielectrically isolated wells formed by oxide walls in said monolithic backing in dielectric isolation from said first wells;
   wherein at least one of said active components is constructed with at least one diffusion in abutment with the oxide walls of the dielectrically isolated wells to form a diffusion/wall interface for maximizing use of area within a well and for minimizing undesired electric fields at the diffusion/wall interface, and wherein a thin layer of dopant is provided on at least a part of the inner surface of the wall, said dopant being in sufficient concentration to prevent inversion along an interdiffusion channel of a parasitic MOSFET formable under expected operating conditions.

6. In a device according to claim 5, wherein a diffusion/wall interface is formed along at least a portion of a drain diffusion.

7. In a device according to claim 6, wherein a diffusion/wall interface is formed along all sides of the drain diffusion adjacent an isolation wall.

* * * * *